(12) United States Patent
Tran

(10) Patent No.: US 7,064,422 B2
(45) Date of Patent: Jun. 20, 2006

(54) ELECTRONIC ASSEMBLY WITH INTEGRATED IO AND POWER CONTACTS

(75) Inventor: Donald T. Tran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/810,957

(22) Filed: Mar. 26, 2004

(65) Prior Publication Data

US 2005/0212120 A1  Sep. 29, 2005

(51) Int. Cl.
*H01L 23/02* (2006.01)

(52) U.S. Cl. ...................... 257/678; 257/685
(58) Field of Classification Search ............ 257/678, 257/685, 686
See application file for complete search history.

(56) References Cited

U.S. PATENT DOCUMENTS

2005/0051889 A1* 3/2005 Wood et al. ................ 257/712

* cited by examiner

*Primary Examiner*—Roy Potter
(74) *Attorney, Agent, or Firm*—Schwegman, Lundberg, Woessner & Kluth, P.A.

(57) ABSTRACT

In some example embodiments, an integrated circuit, electronic assembly and method provide a current path for supplying power to a processor. As an example, the integrated circuit includes a base having power contacts that extend from an upper surface of base. The integrated circuit further includes a substrate that is mounted to the upper surface of the base to electrically couple the substrate to the base. A die is mounted on a substrate such that the die is electrically coupled to the substrate. The power contacts on the upper surface of the base engage a daughterboard so that the die is able to receive power from a voltage source mounted on the daughterboard through the power contacts on the upper surface of the base.

26 Claims, 5 Drawing Sheets

ELECTRONIC ASSEMBLY WITH INTEGRATED IO AND POWER CONTACTS

TECHNICAL FIELD

Some example embodiments of the present invention relate to an integrated circuit and electronic assembly that include a processor, and more particularly, an integrated circuit, an electronic assembly and method with an improved design for providing power to the processor.

BACKGROUND

The current paths in integrated circuits and other electronic assemblies that include processors are continually being required to handle ever-increasing amounts of current in order power the processors. Processors typically require more power in order to operate at higher frequencies and to simultaneously perform numerous logic and memory operations.

Some of the designs that are used to provide power to high performance processors incorporate a voltage regulator that is mounted onto a separate daughter card. The daughter card is typically positioned above and around the processor to supply power directly to a substrate where the processor is mounted using a power connector. I/O signals are typically delivered to the processor through the substrate using an LGA socket that is situated underneath the substrate where the processor is mounted.

One drawback of such designs is that they require a separate power connector. The power connector adds unwanted expense to the cost associated with producing electronic systems that include processors. In addition, the substrate where the processor is mounted typically needs to be relatively thick so that the LGA socket, which is situated beneath the substrate, is able to withstand substantial compression loading.

Another drawback with such designs is that the substrate must typically be elongated and/or widened to account for any power pads that must be connected to the power connector on the daughter card. Elongating and/or widening the substrate where the processor is mounted uses up precious space within electronic systems that include processors and is not cost effective since a typical substrate is relatively expensive.

In some electronic assemblies, the substrate where the processor is mounted is susceptible to warping that is induced by residual stress within the substrate. There is typically residual stress within the substrate as a result of the manufacturing processes that are associated with producing a package that includes a die mounted on a substrate.

When such a package is mounted against a land grid array (LGA) on a socket, a high compression force is required to ensure proper connection with the contacts in the LGA. A typical LGA on a socket may include over 1000 contacts such that a compression load of more than 150 lbf needs to be applied between the package and the socket. The die and the substrate within the package are vulnerable to failures (e.g., cracking and/or delaminating) when such a relatively high compression load is applied between the package and the socket.

There is a need for an electronic assembly where the size of a substrate that is within a package mounted to an LGA on a socket is reduced to minimize cost and save space. In addition, the LGA that forms part of the connection between the package and the socket should be capable of withstanding a compression load that is required to ensure proper connection with the contacts in the LGA without risk of damage to the components in the package.

DETAILED DESCRIPTION

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

In some embodiments, the integrated circuit, electronic assembly and method provide a current path for supplying power to a processor. Power is supplied to a processor, or die, using power contacts that extend from an upper surface of a base which supports a substrate where the die is mounted. The configuration allows the substrate size to be minimized. In addition, the components within the integrated circuit and electronic assembly are more readily able to handle compressive loads when the components are compressed together.

Figure 1:
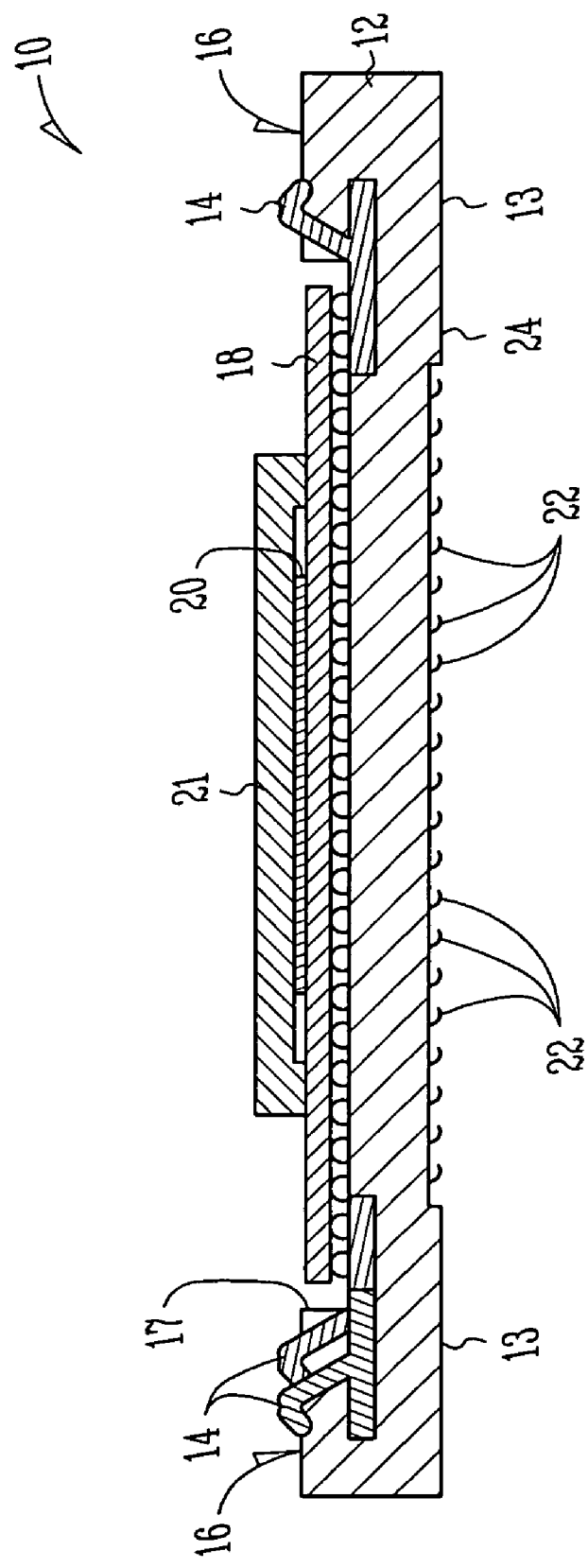
FIG. 1 is a schematic section view of an integrated circuit.
Figure 2:
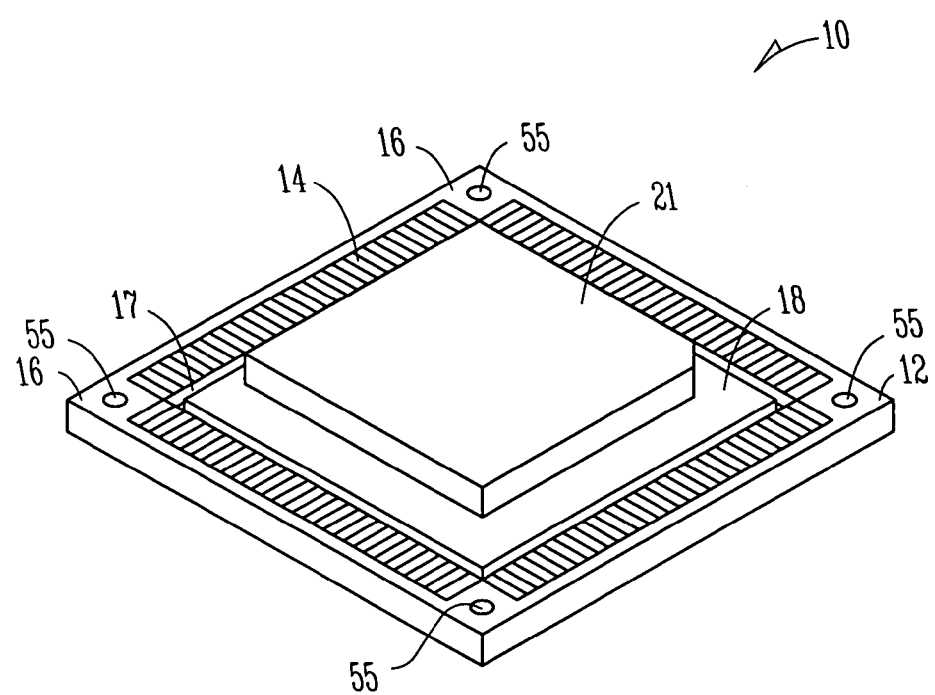
FIG. 2 is a perspective view of the integrated circuit shown in FIG. 1.

FIGS. 1 and 2 illustrate an integrated circuit 10 that includes a base 12 having power contacts 14 which extend from an upper surface 16 of base 12. Integrated circuit 10 further includes a substrate 18 mounted to the upper surface 16 of base 12 such that substrate 18 is electrically coupled to base 12. A die 20 is mounted on substrate 18 such that die 20 is electrically coupled to substrate 18.

Figure 3:
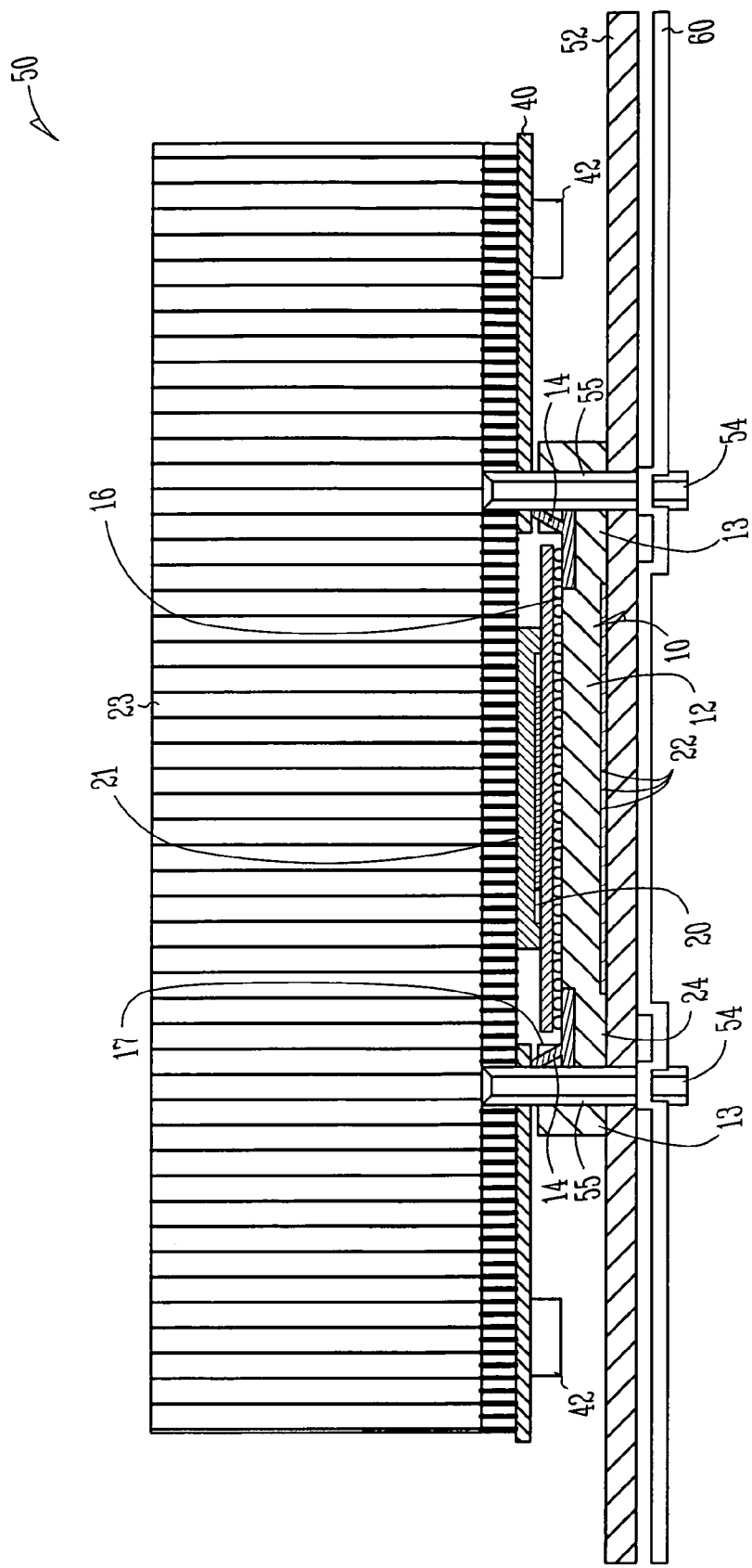
FIG. 3 is a schematic section view illustrating an electronic assembly that incorporates the integrated circuit shown in FIGS. 1 and 2.

As shown in FIG. 3, power contacts 14 on the upper surface 16 of base 12 engage a daughterboard 40 so that current may be supplied to die 20 from a voltage source 42 (e.g., voltage regulator) mounted on daughterboard 40. During operation of integrated circuit 10, most of the current may be supplied to die 20 through power contacts 14.

The upper surface 16 of base 12 may further includes a recess 17 such that substrate 18 is mounted within recess 17. It should be noted that although substrate 18 and recess 17 are shown as square-shaped, substrate 18 and recess 17 may be any size and shape. In some forms, substrate 18 may be surface mounted to the upper surface 16 of base 12.

In other embodiments, base 12 further includes I/O contacts 22 that extend from a bottom surface 24 of base 12. Power contacts 14 may be blade type while I/O contacts 22 may be formed in a large grid array. Although power contacts 14 are shown in FIG. 2 as being positioned in a staggered arrangement along each side of substrate 18, power contacts 14 may be positioned along one or more sides of substrate 18. In addition, the number, size, type and arrangement of power contacts 14 and I/O contacts 22 may vary depending on the design of integrated circuit 10. I/O contacts 22 may be located directly below die 20 to minimize the distance between I/O contacts 22 and die 20.

The power contacts 14 may be made of metal that is up to three times thicker than contacts in existing integrated circuits that supply power to a processor using a voltage source mounted on a daughterboard. The thicker contacts reduce parasitic resistance within the integrated circuit 10 and make integrated circuit 10 more robust when it is assembled into an electronic assembly (see, e.g., electronic assembly 50 in FIG. 3). In some forms, a tip of each power contact 14 may be rolled inward to make it less susceptible to handling damage.

In some forms, base 12 is made of a material (e.g., plastic) that is adapted to handle compressive loads. One example material for base 12 is a liquid crystal polymer, although other materials may also be used.

In some forms, die 20 may be made of semiconducting material that has been separated from a wafer. Wafers may be made of semiconducting, non-semiconducting, or combinations of semiconducting and non-semiconducting materials. In some embodiments, a heat spreader 21 may be coupled to die 20 to remove heat from die 20 during operation of integrated circuit 10.

FIG. 3 illustrates an example embodiment of an electronic assembly 50 that includes integrated circuit 10. Electronic assembly 50 may include a motherboard 52 positioned adjacent to the bottom surface 24 of base 12 such that motherboard 52 is electrically coupled to base 12 (e.g., through I/O contacts 22). As discussed above, electronic assembly 50 further includes daughterboard 40 that engages power contacts 14 on the upper surface 16 of base 12 to electrically couple one or more voltage sources 42 on daughterboard 40 to die 20.

Electronic assembly 50 may further include a heat sink 23 that is coupled to heat spreader 21. In some forms, heat sink 23 may be coupled directly to die 20.

In some embodiments, electronic assembly 50 further includes one or more fasteners 54 that compress base 12 against motherboard 52 and daughterboard 40. FIG. 3 shows that fasteners 54 may be used to secure electronic assembly 50 to a chassis 60 such that motherboard 52, base 12 and daughterboard 40 are compressed between heat sink 23 and chassis 60. The fasteners 54 may apply a relative high compression load (>200 lbs), however the majority of the compression load is supported by power contacts 14 and the upper surface 16 of base 12 instead of heat spreader 21, die 20 and substrate 18. Since less of the compression load is applied to die 20 and substrate 18, there is a reduced possibility of damage to electrical connections within the electronic assembly 50.

In the example embodiment illustrated in FIG. 3, motherboard 52 is rigidly supported on chassis 60. Four fasteners 54 (e.g., bolts) extend across heat sink 23 through holes 55 (see FIG. 2) at each corner of base 12 (only two fasteners 54 and holes 55 are shown in FIG. 3). Fasteners 54 extend through motherboard 52 and are threaded into chassis 60.

As the fasteners 54 are tightened, a compressive force is generated on base 12, I/O contacts 22, heat spreader 21 and heat sink 23. In some embodiments, base 12 may include one or features 13 that serve as a stop. These stopping features 13 (see FIGS. 1 and 3) prevent electronic assembly 50 from being over-compressed and ensure that the I/O contacts 22 are compressed down to an acceptable height when fasteners 54 secure electronic assembly 50 to chassis 60.

Integrated circuit 10 may be adapted for use with other components in an electronic assembly. In some embodiments, the components in an electronic assembly will be determined based on the space available and the application where the electronic assembly is to be used (among other factors). It should be noted that the configuration of integrated circuit 10 may also allow the overall height (i.e., thickness) of an electronic assembly that includes integrated circuit 10 to be reduced because the power contacts are part of base 12.

Figure 4:
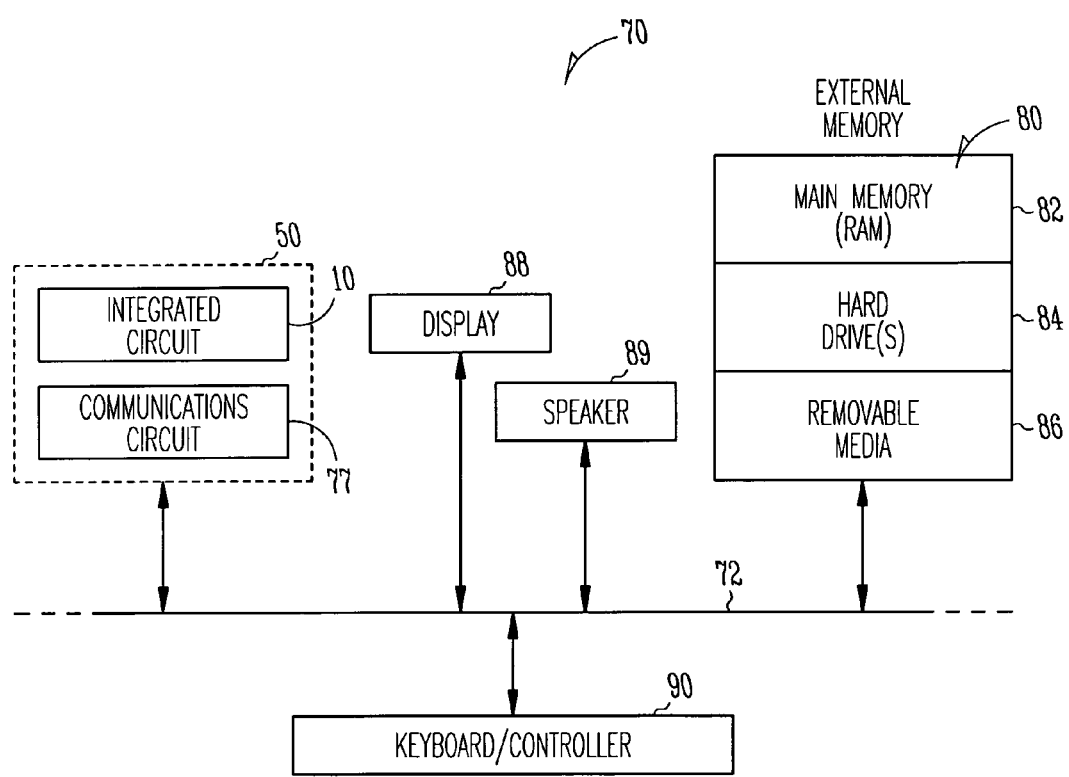
FIG. 4 is a block diagram of an electronic system that incorporates the electronic assembly shown in FIG. 3.

FIG. 4 is a block diagram of an electronic system 70 incorporating at least one electronic assembly (e.g., electronic assembly 50 shown in FIG. 3) described herein, which includes one or more types of integrated circuits (e.g., integrated circuit 10 shown FIGS. 1 and 2) described herein. Electronic system 70 may be a computer system that includes a system bus 72 which electrically couples the various components of electronic system 70 together. System bus 72 may be a single bus or any combination of busses.

Electronic assembly 50 is electrically coupled to system bus 72 and may include any circuit, or combination of circuits. In one embodiment, electronic assembly 50 includes one or more of the integrated circuits 10 described herein. Integrated circuit 10 may include a processor which can be of any type. As used herein, processor means any type of circuit such as, but not limited to, a microprocessor, a microcontroller, a graphics processor or a digital signal processor.

Other types of circuits that may be included in electronic assembly 50 are a custom circuit or an application-specific integrated circuit, such as communications circuit 77 for use in wireless devices such as cellular telephones, pagers, portable computers, two-way radios, and similar electronic systems.

Electronic system 70 may also include an external memory 80 that in turn may include one or more memory elements suitable to the particular application, such as a main memory 82 in the form of random access memory (RAM), one or more hard drives 84, and/or one or more drives that handle removable media 86, such as diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

The integrated circuits and electronic assemblies described herein may be implemented in a number of different embodiments, including an electronic package, an electronic system, a computer system, one or more methods of fabricating an integrated circuit, and one or more methods of fabricating an electronic assembly that includes the integrated circuit. The elements, materials, geometries, dimensions, and sequence of operations can all be varied to suit particular packaging requirements.

Figure 5:
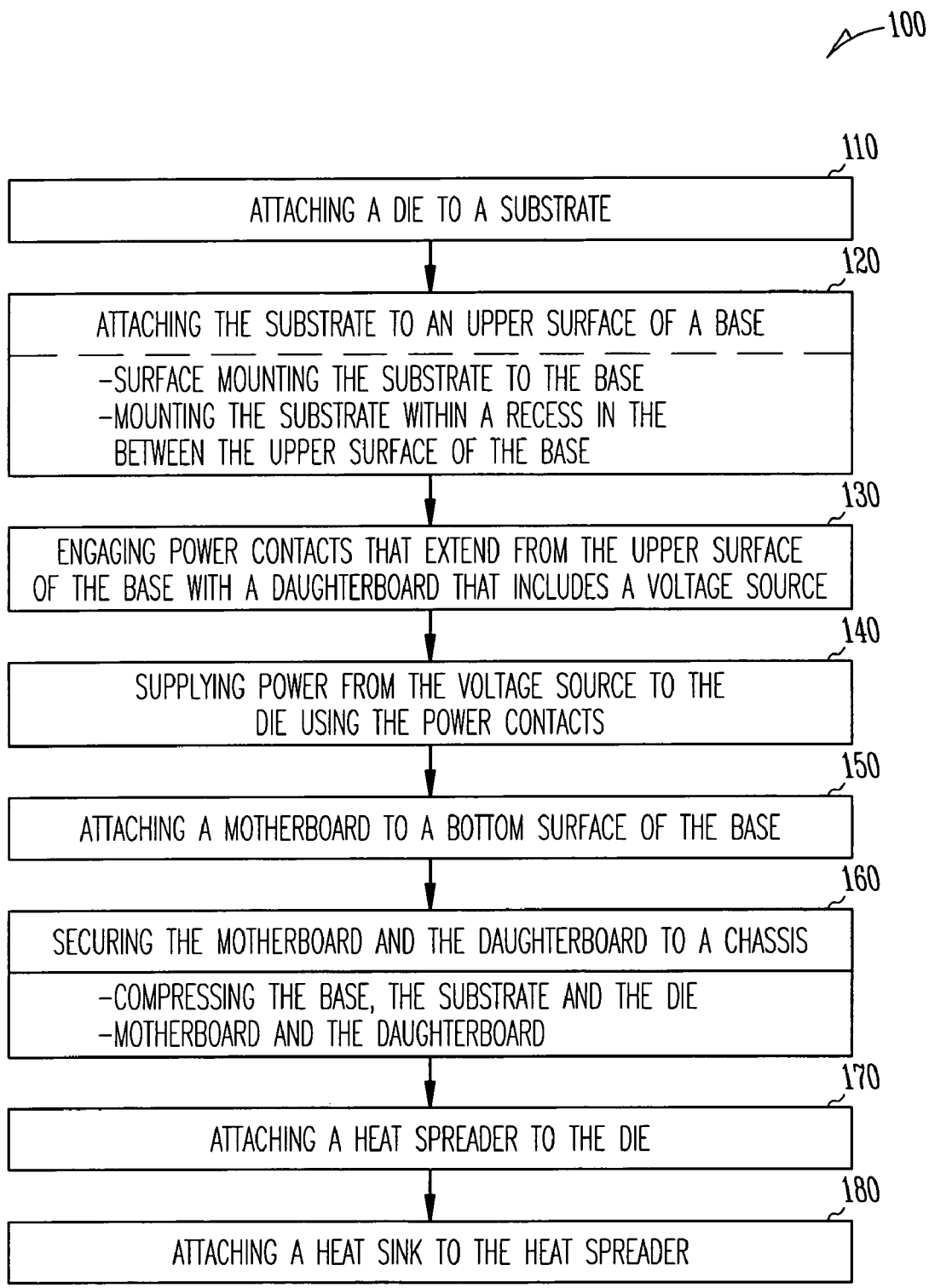
FIG. 5 illustrates a method that includes engaging power contacts that extend from an upper surface of a base with a daughterboard that includes a voltage source.

FIG. 5 illustrates one example embodiment of a method 100 that includes 110 attaching a die to a substrate and 120 attaching the substrate to an upper surface of a base. The method further includes 130 engaging power contacts that extend from the upper surface of the base with a daughterboard that includes a voltage source and 140 supplying power from the voltage source to the die using the power contacts. In some embodiments, 120 attaching the substrate to an upper surface of a base includes (i) surface mounting the substrate to the base; and/or (ii) mounting the substrate within a recess in the upper surface of the base.

The method may further include (i) 150 attaching a motherboard to a bottom surface of the base; (ii) 160 securing the motherboard and the daughterboard to a chassis; (iii) 170 attaching a heat spreader to the die; and/or (iv)

180 attaching a heat sink to the heat spreader. It should be noted that 160 securing the motherboard and the daughterboard to a chassis may include compressing the base, the substrate and the die between the motherboard and the daughterboard.

FIGS. 1–5 are merely representational and are not drawn to scale. Certain proportions thereof may be exaggerated while others may be minimized.

The integrated circuit described above provides a solution for supplying power to processors that are powered by high currents. The design of the integrated circuit improves the reliability and overall system cost as compared to existing integrated circuits where processors are powered by a voltage source on a daughterboard. Many other embodiments will be apparent to those of skill in the art from the above description.

What is claimed:

1. An integrated circuit comprising:
   a base that includes power contacts which extend from an upper surface of the base to receive power from a voltage source;
   a substrate mounted to the upper surface of the base, the substrate being electrically coupled to the base, wherein the upper surface of the base includes a recess, the substrate being mounted within the recess; and
   a die mounted on the substrate, the die being electrically coupled to the substrate to receive power from the voltage source through the power contacts on the base.

2. The integrated circuit of claim 1, wherein the voltage source is a voltage regulator.

3. The integrated circuit of claim 1, wherein the base further includes I/O contacts extending from a bottom surface of the base.

4. The integrated circuit of claim 3, wherein the power contacts are blade type and the I/O contacts are formed in a large grid array.

5. The integrated circuit of claim 1, wherein the substrate is surface mounted to the base.

6. The integrated circuit of claim 1, further comprising a heat spreader coupled to the die.

7. An electronic assembly comprising:
   a base that includes power contacts which extend from an upper surface of the base;
   a substrate mounted to the upper surface of the base;
   a die mounted on the substrate;
   a motherboard positioned adjacent to a bottom surface of the base, the motherboard being electrically coupled to the base; and
   a daughterboard engaging the power contacts on the upper surface of the base to electrically couple a voltage source on the daughterboard to the die.

8. The electronic assembly of claim 7, wherein the substrate is surface mounted to the base.

9. The electronic assembly of claim 7, further comprising at least one fastener that compresses the base against the motherboard and the daughterboard.

10. The electronic assembly of claim 7, further comprising a heat spreader coupled to the die and a heat sink coupled to the heat spreader.

11. The electronic assembly of claim 10, further comprising at least one fastener to secure the electronic assembly to a chassis.

12. The electronic assembly of claim 11, wherein the motherboard, the base and the daughterboard are positioned between the heat sink and the chassis when the electronic assembly is coupled to the chassis.

13. The electronic assembly of claim 7, wherein the upper surface of the base includes a recess, the substrate being mounted within the recess.

14. The electronic assembly of claim 7, wherein the base further includes I/O contacts extending from a bottom surface of the base to engage the motherboard.

15. The electronic assembly of claim 14, wherein the power contacts are blade type and the I/O contacts are formed in a large grid array.

16. An electronic system comprising:
   a bus;
   a memory coupled to the bus;
   an electronic assembly that includes a motherboard and a daughterboard where at least one of the motherboard and the daughterboard are coupled to the bus, the electronic assembly further including a base mounted on the motherboard, a substrate mounted to an upper surface of the base and a die mounted on the substrate, the base including power contacts that extend from the upper surface of the base to engage the daughterboard; and
   a voltage source mounted on the daughterboard to provide power to the die through the power contacts.

17. The electronic system of claim 16, wherein the base further includes I/O contacts extending from a bottom surface of the base to engage the motherboard.

18. The electronic system of claim 17, wherein the power contacts are blade type and the I/O contacts are formed in a large grid array.

19. The electronic system of claim 16, wherein the upper surface of the base includes a recess, the substrate being mounted within the recess.

20. The electronic system of claim 16, wherein the substrate is surface mounted to the base.

21. An integrated circuit comprising:
   a base that includes power contacts which extend from an upper surface of the base to receive power from a voltage source, the base further including I/O contacts that extend from a bottom surface of the base, the power contacts being of a blade type and the I/O contacts being formed in a large grid array;
   a substrate mounted to the upper surface of the base, the substrate being electrically coupled to the base; and
   a die mounted on the substrate, the die being electrically coupled to the substrate to receive power from the voltage source through the power contacts on the base.

22. The integrated circuit of claim 21, wherein the voltage source is a voltage regulator.

23. The integrated circuit of claim 21, further comprising a heat spreader coupled to the die.

24. An integrated circuit comprising:
   a base that includes power contacts which extend from an upper surface of the base to receive power from a voltage source;
   a substrate that is surface mounted to the upper surface of the base, the substrate being electrically coupled to the base; and
   a die mounted on the substrate, the die being electrically coupled to the substrate to receive power from the voltage source through the power contacts on the base.

25. The integrated circuit of claim 24, wherein the voltage source is a voltage regulator.

26. The integrated circuit of claim 24, further comprising a heat spreader coupled to the die.

* * * * *